United States Patent [19]

Tsubouchi et al.

[11] Patent Number: 5,364,664
[45] Date of Patent: Nov. 15, 1994

[54] PROCESS FOR NON-SELECTIVELY FORMING DEPOSITION FILM ON A NON-ELECTRON-DONATIVE SURFACE

[75] Inventors: Kazuo Tsubouchi; Kazuya Masu, both of Sendai, Japan

[73] Assignee: Canon Kabushiki Kaisha, Tokyo, Japan

[21] Appl. No.: 996,875

[22] Filed: Dec. 22, 1992

Related U.S. Application Data

[63] Continuation of Ser. No. 811,117, Dec. 20, 1991, abandoned.

[30] Foreign Application Priority Data

Dec. 21, 1990 [JP] Japan .................. 2-405190

[51] Int. Cl.$^5$ .................. B05D 3/06; B05D 3/00; C23C 16/00
[52] U.S. Cl. .................. 427/535; 427/576; 427/578; 427/252; 427/255.1; 427/255.2; 427/299
[58] Field of Search ............. 427/569, 573, 576, 564, 427/561, 584, 585, 586, 587, 593, 123, 124, 250, 252, 255.1, 255.2, 299, 533, 534, 535, 578, 255

[56] References Cited

U.S. PATENT DOCUMENTS

| | | | |
|---|---|---|---|
| 4,125,640 | 11/1978 | Conant et al. | 427/250 |
| 4,328,261 | 5/1982 | Heinecke et al. | 427/252 |
| 4,460,618 | 7/1984 | Heinecke et al. | 427/252 |
| 4,489,102 | 12/1984 | Olmer et al. | 427/54.1 |
| 4,923,717 | 5/1990 | Gladfelter et al. | 427/252 |
| 4,963,423 | 10/1990 | Sekiguchi et al. | 427/58 |

FOREIGN PATENT DOCUMENTS 0425084  5/1991  European Pat. Off. .

OTHER PUBLICATIONS

Tsubouchi et al., 1990 Symposium on VLSI Technology, Jun. 1990, pp. 5–6.
Ruzyllo, J. Electrochemical Society 134 (7), Jul. 7, 1987, pp. 1869–1870.
Masu et al., Appl. Phys. Lett. 56 (16), Apr. 16, 1990, pp. 1543–1545.

*Primary Examiner*—Marianne Padgett
*Attorney, Agent, or Firm*—Fitzpatrick, Cella, Harper & Scinto

[57] ABSTRACT

A process for forming a deposition film comprising aluminum comprises the steps of: treating chemically a surface of a substrate having an electron-donative surface and a non-electron-donative surface so as to terminate the electron-donative surface with hydrogen atoms, and thereafter placing the substrate in a space for deposition film formation; introducing gas comprising alkylaluminum hydride and hydrogen gas into the space for deposition film formation; and forming an aluminum film selectively on the electron-donative surface by maintaining the substrate at a temperature in the range of from not lower than the decomposition temperature of the alkylaluminum hydride to not higher than 450° C.

23 Claims, 3 Drawing Sheets

FIG. I
MECHANISM OF SELECTIVE GROWTH OF ALUMINUM — TRANSMISSION OF GENETIC INFORMATION
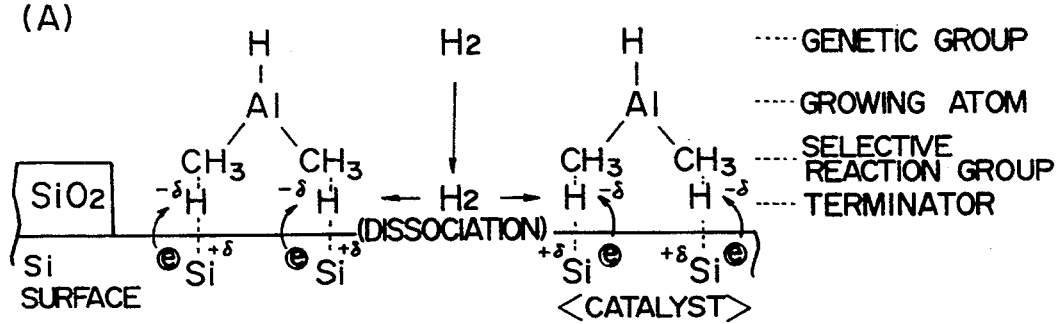
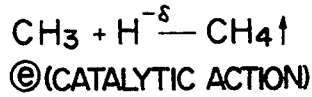
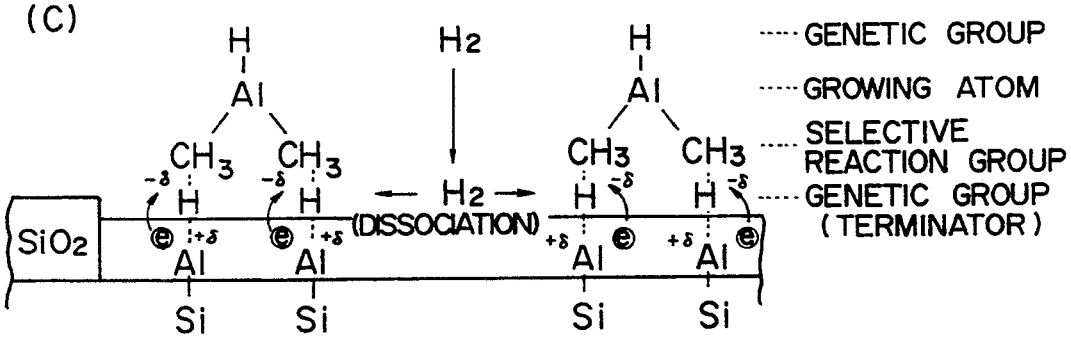

FIG. 2A
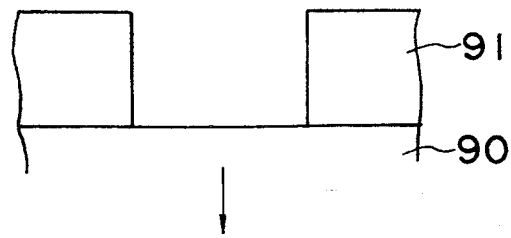
FIG. 2B
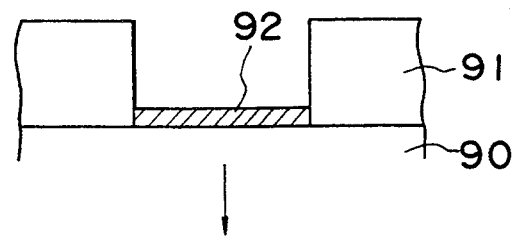
FIG. 2C
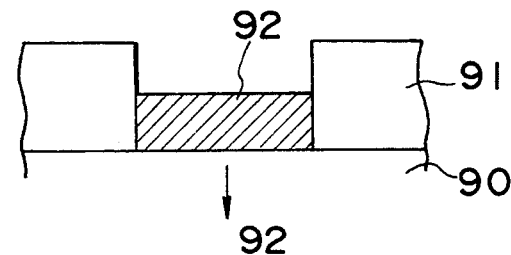
FIG. 2D
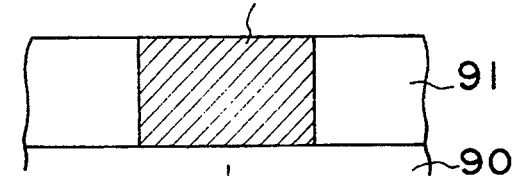
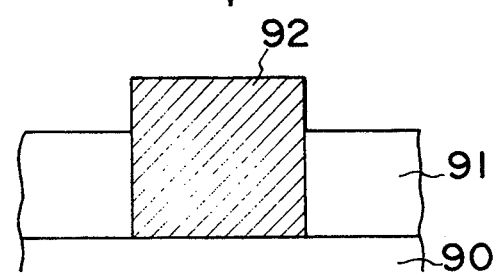
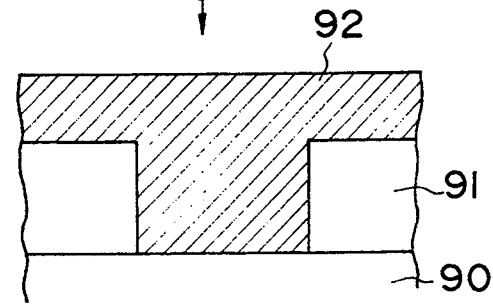
FIG. 2E          FIG. 2F

PROCESS FOR NON-SELECTIVELY FORMING DEPOSITION FILM ON A NON-ELECTRON-DONATIVE SURFACE

This application is a continuation of application Ser. No. 07/811,117 filed Dec. 20, 1991, now abandoned.

BACKGROUND OF THE INVENTION

1. Field of the Invention

The present invention relates to a process for forming a deposition film, particularly to a process for forming an aluminum deposition film suitably used for wiring in semiconductor integrated circuit devices and the like.

2. Related Background Art

In semiconductor electronic devices and semiconductor integrated circuits of the prior art, aluminum (Al) or aluminum-silicon and the like are mainly used as electrodes and wiring materials. Aluminum is advantageous in various points such that it is inexpensive yet has high electroconductivity; its interior is protected and stabilized by a fine oxide film formed on the surface; it has sufficient adhesiveness to silicon; and so forth.

With the recent trend of raising the integration degree of integration circuits such as LSI, finer wiring and multiple-layer wiring are needed, and more severe conditions than ever has come to be required in aluminum wiring. As the result of increase of fineness of the integrated circuit by 1 increase of the integration degree, the surface of LSI or the like is made highly toughened by oxidation, diffusion, thin film deposition, etching, or the like treatment. Therefore, an electrode material or a wiring material has to be deposited on a stepped face without disconnection, or deposited in a deep via hole having a minute diameter. In DRAM (dynamic RAM) of 4 Mbit or 16 Mbit, or the like, the via hole in which a metal such as aluminum is to be deposited has an aspect ratio (via hole depth divided by via hole diameter) is not less than 1.0 and a diameter of the via hole is not larger than 1 $\mu$m. Accordingly, technique is needed for depositing aluminum in a via hole having a high aspect ratio. The aluminum, which is used to fill a via hole, is also to be deposited for wiring in extremely high quality on a insulating film.

Recently, the inventors of the present invention, et al. have proposed the use of dimethylaluminum hydride in a chemical vapor deposition (CVD) process as a technique for forming an aluminum film. Although this process is promising for ultra-fine processing in the semiconductor manufacturing technique, further improvement thereof is desired for raising the yield of production of semiconductor devices to lower the price and to achieve success in commercialization.

The inventors of the present invention have found that the variation in film formation, particularly in an early stage of aluminum deposition, seems to affect the final product yield. The inventors have further found that the variation of properties at the interface between a selectively deposited aluminum film end a non-selectively deposited aluminum film possibly affects the final product yield on basis of the hypothesis of deposition mechanism described later.

SUMMARY OF THE INVENTION

An object of the present invention is to provide a process for forming an electroconductive deposition film which gives wiring of high quality and exhibits excellent step-coverage property.

Another object of the present invention is to provide a process for forming a deposition film comprising aluminum, comprising steps of: conducting a chemical surface treatment to a substrate having an electron-donative surface and a non-electron-donative surface so as to terminate the electron-donative surface with hydrogen atoms, and thereafter placing the substrate in a space for deposition film formation; introducing gas comprising alkylaluminum hydride and hydrogen gas into the space for deposition film formation; and forming a film comprising aluminum selectively on the electron-donative surface by maintaining the substrate at a temperature in the range of from not lower than the decomposition temperature of the alkylaluminum hydride to not higher than 450° C.

Another object of the present invention is to provide a process for forming a deposition film comprising aluminum, comprising steps of: placing a substrate having an electron-donative surface and a non-electron-donative surface in a space for deposition film formation of a chemical vapor deposition (CVD) apparatus capable of generating plasma; introducing gas comprising alkylaluminum hydride and hydrogen gas into the space for deposition film formation; forming a film comprising aluminum selectively on the electron-donative surface by maintaining the the electron-donative surface at a temperature in the range of from not lower than the decomposition temperature of the alkylaluminum hydride to not higher than 450° C.; and forming a further film comprising aluminum on the aluminum film formed as above and the non-electron-donative surface by generating plasma while the gas comprising alkylaluminum hydride and the hydrogen gas are being introduced, the electron density of the plasma being in the range of from $1 \times 10^8$ to $8 \times 10^{10}$ cm$^{-3}$ in vicinity of the surface of the substrate.

BRIEF DESCRIPTION OF THE DRAWINGS

FIG. 1 is a diagram illustrating the mechanism of selective growth of aluminum.

FIGS. 2A, 2B, 2C, 2D, 2E and to 2F are schematic sectional views showing the selective growth of aluminum.

DESCRIPTION OF THE PREFERRED EMBODIMENT

Figure 3:
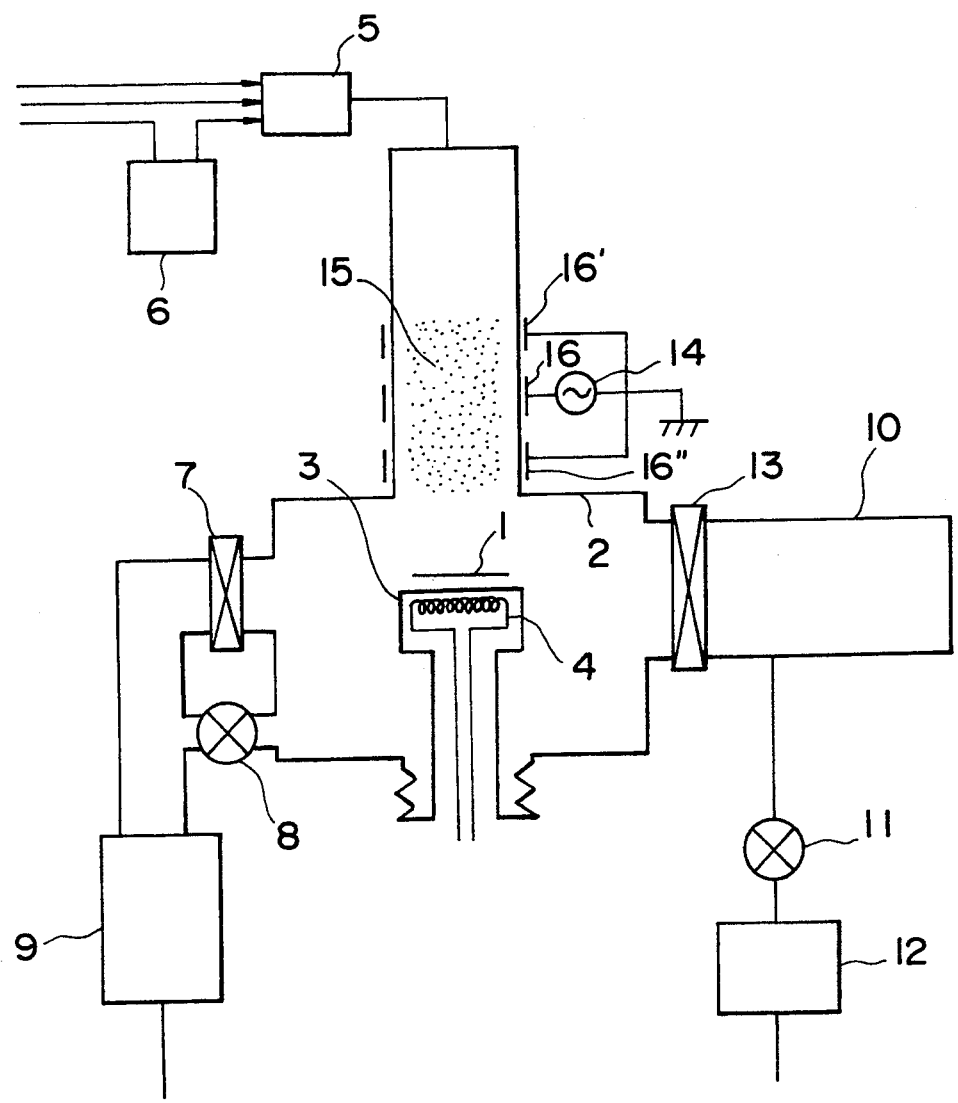
FIG. 3 is a schematic sectional view showing one example of a deposition formation apparatus applicable to the process of the present invention.

Firstly, processes for deposition film formation by use of an organometallic compound are outlined.

The decomposition reaction of an organometallic compound and a thin film deposition reaction depends largely on the kind of the metal, the kind of the alkyl bonded to the metal atom, the means of causing the decomposition reaction, and the conditions of the gas atmosphere.

For example, even an organometallic compound composed of a simplest alkyl group such as methyl, ethyl, and isobutyl, and aluminum or gallium differs in the reaction type depending on the kind of the alkyl group, the kind of the metal, and the exciting decomposition means. Accordingly, in order to deposit a metal from an organometallic compound on a desired substrate, the decomposition reaction has to be extremely strictly controlled. In an instance of depositing aluminum from triisobutylaluminum:

(TIBA: 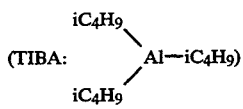)

a conventional low pressure chemical vapor deposition (CVD) process utilizing mainly thermal reaction gives a deposition film having surface roughness of a dimension of several μm, thus being inferior in surface morphology. Further, this process causes hillock on heat treatment, roughening of silicon surface resulting from diffusion of silicon at the interface of aluminum and silicon, and low migration resistance, thus being not suitable for commercial super-LSI processes.

As described above in detail, since the chemical properties of an organometallic compound vary greatly depending on the kind and the combination of the organic substituent bonded to the metal element. Therefore, the CVD process employing an organometallic compound is complicated in deciding the conditions for deposition film formation. When this process is applied to a highly integrated circuit such as DRAM of 4 Mbit or higher, a slight variation of a film-forming condition will give non-usable deposition film (wiring).

The deposition-film-forming process which does not strictly limit film forming conditions and does not require a complicated apparatus to form a deposition film of high quality, namely is tolerable in relatively wide ranges is required.

Intending to find the conditions to exceed the level required for highly integrated circuits, the inventors of the present invention conducted many experiments by using various organometallic compounds and changing the reaction gas, the carrier gas, the substrate temperature, the reaction state of the gas, and so forth.

Consequently, the inventors noticed, as the parameter for providing film-forming conditions widely applicable, the use of an alkylaluminum hydride as the starting raw material gas. As the result of further investigation, the inventors have found the preferred film-forming conditions applicable to highly integrated circuits as follows: Raw material gas: alkylaluminum hydride, Reaction gas: hydrogen, Substrate: those having an electron-donative surface (A) and a non-electron-donative surface (B), Substrate temperature: the temperature of the electron-donative surface (A) being not lower than the decomposition temperature of the alkylaluminum hydride but not higher than 450° C. According to such film-forming conditions, aluminum can be deposited firstly in a via hole with high surface smoothness and high fineness.

Dimethylaluminum hydride (DMAH), as the alkylaluminum hydride in the present invention, is a known substance. However, it could not be foreseen what type of aluminum thin film is deposited in what type of reaction, without forming under every condition. For example, an aluminum which is deposited from DMAH by optical CVD is inferior in the film quality, having poor surface morphology and resistance of from several to 10 μΩ.cm which is higher than the bulk value (2.7 μΩ.cm).

On the contrary, the present invention employs a CVD method for depositing selectively an aluminum or aluminum-silicon film in high quality as an electroconductive deposition film on a substrate.

In the present invention, dimethylaluminum hydride (DMAH)

Chemical formula: 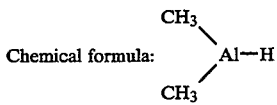

or monomethyl aluminum hydride (MMAH$_2$)

Chemical formula: 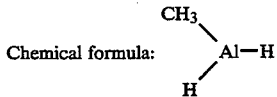

is employed as the starting raw material gas containing at least one atom for a constitutional element of the deposition film, and H$_2$ as a reaction gas. An aluminum film is formed on a substrate by gas phase growth using a mixture gas of them. Alternatively, dimethylaluminum hydride (DMAH) or monomethyl aluminum hydride (MMAH$_2$) and a gas containing Si as the starting raw material gas and H$_2$ as a reaction gas are employed. An aluminum-silicon film is formed on a substrate by gas-phase growth using the gas mixture.

The substrate applicable in the present invention includes those having a first substrate surface material for providing the surface for aluminum deposition and a second substrate surface material for providing the surface on which aluminum is not deposited. The first substrate surface material is a material having an electron-donative property. The electron-donative property is explained below in detail.

The electron-donative material is a material having free electrons inherently or electrons intentionally formed therein, for example a material having a surface which accelerates a chemical reaction by electron exchange with a starting raw material gas molecule adhering on a surface thereof. The material includes generally metals and semiconductors. It also includes metals and semiconductors having a thin oxide film on the surface. Such a material causes chemical reaction by electron exchange with adhering raw material molecules.

Specifically, the electron-donative material includes semiconductors such as monocrystalline silicon, polycrystalline silicon, amorphous silicon, etc.; binary, ternary, or quaternary III-V group compound semiconductors composed of combination of a III group element such as gallium, indium, and aluminum with a V group element such as phosphorus, arsine, and nitrogen; metals, alloys, silicides, and the like. More specifically, it includes tungsten, molybdenum, tantalum, tungsten silicide, titanium silicide, aluminum, aluminum-silicon, titanium-aluminum, titanium nitride, copper, aluminum-silicon-copper, aluminum-palladium, titanium, molybdenum silicide, tantalum silicide, and the like.

On the other hand, the non-electron-donative material, which forms a surface on which aluminum or aluminum silicon does not deposit selectively, includes silicon oxides formed by thermal oxidation, CVD, sputtering etc.; glass such as BSG, PSG, BPSG, etc.; or oxide films; thermally formed nitride films; silicon nitride films formed by plasma CVD, low pressure CVD, ECR-CVD, etc.; and the like.

Onto a substrate having such a constitution, aluminum deposits in a reaction system of a starting raw material gas and H$_2$ by only a simple thermal reaction. For example, the thermal reaction in the reaction system of DMAH and hydrogen, at a substrate temperature in the range of from 160° C. to 450° C., is found to give aluminum deposition, or aluminum-silicon deposition if silicon-containing gas is added thereto, selectively on the surface having an electron-donative material, basically according to the reaction:

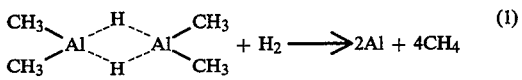

DMAH and $H_2$ are used for deposition of pure aluminum, while DMAH, $Si_2H_6$, and $H_2$ are used for deposition of aluminum-silicon.

FIGS. 2A to 2E illustrate schematically the selective growth of deposition in the case where DMAH and $H_2$ are used, or in the case where DMAH, $Si_2H_6$, and $H_2$ are used.

FIG. 2A is a schematic cross-sectional view of a substrate before formation of a deposition film of aluminum or aluminum-silicon. The numeral 90 denotes a substrate composed of an electron-donative material, such as a silicon wafer. The numeral 91 denotes a thin film composed of a non-electron-donative material, for example thermally oxidized silicon dioxide film and a BSG film.

The substrate is chemically treated to terminate the surface with hydrogen atoms before conducting the deposition.

When a gas mixture containing DMAH and $Si_2H_6$ (disilane) as the starting raw material gas and hydrogen as the reaction gas is supplied onto the substrate 90 kept at a temperature in the range from not lower than decomposition temperature of DMAH to not higher than 450° C., aluminum-silicon deposite on the substrate 90 to form a continuous film 92 as shown in FIG. 2B.

By continuation of the deposition of aluminum-silicon, the aluminum-silicon film grows through the state shown in FIG. 2C to the uppermost level of the thin film 91 as shown in FIG. 2D. The aluminum-silicon film can grow further to a level of 5000 Å with little growth in a lateral direction as shown in FIG. 2E. This phenomenon is the most characteristic of deposition film derived from DMAH and $H_2$, or DMAH, $H_2$ and $Si_2H_6$. This shows the possibility of preparing a film of high quality with high selectivity.

This film is not contaminated with an impurity such as carbon and oxygen according to the analysis by auger electron spectroscopy and photoelectron spectroscopy.

The deposition film thus formed is continuous and flat, and has a resistivity of from 2.7 to 3.0 $\mu\Omega.cm$ at a film thickness of 400 Å at room temperature, which is approximately equal to the resistivity of aluminum bulk. Even the film of 1 $\mu m$ thick has also a resistivity of approximately 2.7 to 3.0 $\mu\Omega.cm$. Thus sufficiently fine film having large thickness can be formed. The thin film has a reflectivity of approximately 80% at visible wavelength region, and is excellent in surface flatness.

In super-LSI, the multilayer wiring step requires indispensably the technique of filling selectively a via hole with high-quality aluminum or aluminum-silicon as shown in FIG. 2D. Furthermore, after the selective deposition as shown in FIG. 2D, if additional aluminum or aluminum-silicon can be deposited in the same reaction chamber on the aluminum or aluminum-silicon which is an electron-donative material as well as on the non-electron-donative material such as thermal oxidized silicon dioxide film and a CVD-BSG films as shown in FIG. 2F, then a highly reliable multilayer wiring can be realized without wiring disconnection at a stepped portion or other disadvantages.

However, the formation of aluminum film on the thin film 91 requires some technique, because aluminum film growth is extremely selective in growth on an electron-donative surface by use of alkylaluminum hydride and hydrogen at a temperature of from not lower than decomposition temperature of the alkylaluminum hydride to not higher than 450° C. The formation of aluminum film on the non-electron-donative surface can be made practicable by modification of the non-electron-donative surface, though it is not possible without modification of the surface because of the aforementioned selectivity.

The surface modification referred in the specification requires supply of electron onto the non-electron-donative substrate surface.

This method naturally offsets the disadvantages such that a wafer is exposed unavoidably to air during the transfer thereof after a CVD process to another sputtering apparatus, causing formation of a high-resistance layer containing oxygen or the like at the interface between the selectively grown aluminum film and the non-selectively grown aluminum film, increasing the contact resistance and preventing a low-resistance wiring.

Further, the present invention enables also deposition of aluminum or aluminum-silicon as shown in FIG. 2F by use of one CVD apparatus.

The action of the present invention is practiced in a manner as below. Firstly, the deposition is conducted to fill the via hole as shown in FIGS. 2A to 2E by using DMAH and $H_2$, or DMAH, $Si_2H_6$ and $H_2$. Subsequently, the non-electron-donative surface is modified effectively into an electron-donative surface, and then aluminum or aluminum-silicon is deposited evenly on the surface of aluminum or aluminum-silicon which is an electron-donative material as well as on the surface of non-electron-donative material which has substantially become an electron-donative surface by surface modification. Here, the "surface modification" means an operation by which the non-electron-donative surface is changed so as to be capable of contributing a surface reaction as if it has free electrons. The modification method includes methods of supplying free electrons onto the surface, such as plasma treatment, ion irradiation, and electron beam irradiation. In the case of a silicon dioxide surface, the modification method also includes irradiation of light having energy larger than the forbidden band width of the silicon dioxide to form free electrons on the non-electron-donative surface.

In an example, when RF plasma is generated while supplying DMAH and $H_2$, electrons are supplied from the plasma onto the non-electron-donative surface. The supply of electrons onto the surface makes a hydrogen molecule dissociate into hydrogen atoms as is well known. The hydrogen atoms, staying on the non-electron-donative surface, will react with the continuously flowing DMAH to deposit an aluminum film. In another possibility, hydrogen atoms and electrons are supplied directly from hydrogen plasma onto the surface of the non-electron-donative substrate to react DMAH to form an aluminum film. According to the hypothesis mentioned later, the non-symmetry of the DMAH molecule is important. The DMAH molecules have the reacting group $CH_3$ which causes the surface reaction at the modified surface of the substrate, and the genetic group H which forms a surface equivalent to the modified surface and is indispensable for continuing the reaction. Therefore there is capable of forming the deposition by the reaction at the substrate surface and continuing the reaction.

In the surface modification by plasma as mentioned above, the electron density in plasma in the vicinity of the substrate surface is in the range of from $1 \times 10^8$ to $8 \times 10^{10}$ cm$^{-3}$, preferably from $5 \times 10^8$ to $2 \times 10^9$ cm$^{-3}$. The plasma power density is preferably in the range of from 0.04 to 0.4 W/cm$^3$. The term "vicinity of the substrate" means the space within the distance of 1 cm from the substrate surface. In a specific example, the electron density is $1 \times 10^{10}$ cm$^{-3}$ at the center of the plasma, and $1 \times 10^8$ cm$^{-3}$ in the vicinity of the substrate. The electron density in the present invention can be measured by a known method including a thermal desorption spectroscopy method and a high resolution electron energy-loss spectroscopy (HEELS) method.

FIG. 3 illustrate schematically an example of the deposition-film-forming apparatus applicable to the present invention. A substrate 1, on which an aluminum-silicon film is formed, is put on a substrate holder 3 placed inside a reaction tube 2 which forms the substantially closed space for deposition film formation. The reaction tube 2 is preferably made of quartz, but may be made of a metal. In this case, it is preferably cooled. The substrate holder 3 is made of a metal, and is provided with a heater 4 to heat the substrate placed thereon. The heater 4 is constituted so that the heating temperature may be controlled to control the temperature of the substrate.

The gas-supplying system is constituted as follows. A gas mixer 5 mixes a first starting raw material gas, a second starting raw material gas and a reaction gas, and supplies the mixture into the reaction tube 2. A vaporizer 6 vaporizes an organometallic compound as the starting raw material gas. The organometallic compound employed in the present invention, which is in a liquid state at room temperature, is vaporized by passing a carrier gas through the liquid organometallic compound, and is introduced as a saturated vapor into the mixer 5.

The evacuation system is constituted as follows. A gate valve 7 is opened, when a large volume of gas is evacuated, for example, in evacuation of gas within the reaction tube 2 before beginning of deposition film formation. A slow leak valve 8 is used for a small volume of evacuation, such as in control of the internal pressure of the reaction tube 2 during deposition film formation. An evacuation unit 9 comprises an evacuation pump such as a turbo-molecular pump, and so forth.

The delivery system for the substrate 1 is constituted as follows. A substrate-delivering chamber 10 is capable of housing the substrate before and after the deposition film formation, and is evacuated by opening a valve 11. An evacuation unit 12 is constituted of evacuation pump such as a turbo-molecular pump, and evacuates the delivering chamber. A valve 13 is opened only when the substrate 1 is delivered between the reaction chamber and the delivering space.

Electrode 16 as the plasma-producing means which is installed at the periphery of the reaction tube 2 is connected to an AC power source, and is capable of generating plasma 15.

Gaseous DMAH is formed by bubbling the liquid DMAH kept at room temperature by passing hydrogen, or argon (or another inert gas) as a carrier gas in the vaporizer (gas-forming chamber) 6 as shown in FIG. 3, and the gaseous DMAH is fed to the mixer 5. Hydrogen as the reaction gas is fed through a separate path to the mixer 5. The flow rate of the gases are controlled to give desired partial pressures, respectively.

The first starting raw material gas may be MMAH$_2$, but is preferably DMAH in an amount to obtain a vapor pressure of 1 Torr at room temperature. A mixture of DMAH with MMAH$_2$ may be used therefor.

The second starting raw material gas which contains silicon includes Si$_2$H$_6$, SiH$_4$, Si$_3$H$_8$, Si(CH$_3$)$_4$, SiCl$_4$. SiH$_2$Cl$_2$, and SiH$_3$Cl. Among them, particularly preferred are Si$_2$H$_6$ which is readily decomposable at a low temperature of from 200° to 300° C. The gas such as of Si$_2$H$_6$ diluted with hydrogen or argon is fed to the mixer 5 through a system separate from the DMAH-feeding system, and further fed to the reaction tube 2.

In the surface modification employing a gas, one method is to feed a gas containing silicon or a gas containing titanium such as titanium tetrachloride (TiCl$_4$) to the mixer 5 through another piping system separate from the lines of the DMAH-containing gas and silicon-containing gas.

When a gas mixture of DMAH and hydrogen for deposition of aluminum, or a gas mixture of DMAH, Si$_2$H$_6$ and hydrogen for deposition of aluminum-silicon is introduced onto the substrate 1 heated at a temperature of from not lower than the decomposition temperature of DMAH to not higher than 450° C., aluminum or aluminum-silicon deposits on the substrate 1 to form a continuous film as shown in FIG. 2B.

On continuation of deposition of aluminum or aluminum-silicon under the above-mentioned conditions, the aluminum or aluminum-silicon film grows through the state shown in FIG. 2C up to the uppermost level of the thin film 91 as shown in FIG. 2D. The selectively deposited film is monocrystal.

In this stage, with the DMAH and the Si$_2$H$_6$ being continuously fed, the "surface modification" is conducted to cause a surface reaction on the aforementioned non-electron-donative surface, and thereafter the DMAH and the Si$_2$H$_6$ are continuously fed to deposit aluminum or aluminum-silicon in a shape as shown in FIG. 2F.

The temperature of the substrate is, as mentioned above, preferably in the range of from not lower than the decomposition temperature of the aluminum-containing starting raw material gas to 450° C. Specifically, the temperature of the substrate is preferably in the range of from 200° to 450° C. Under such a deposition condition, the deposition rate is as great as from 100 Å/min to 800 Å/min at the internal pressure of the reaction vessel of $10^{-3}$ 760 Torr and the DMAH partial pressure of $1.5 \times 10^{-5}$ to $1.3 \times 10^{-3}$ times the internal pressure of the reaction vessel. This deposition rate is sufficiently high for aluminum-silicon deposition technique for super-LSI.

More preferably, the temperature of the substrate is in the range of from 270° to 350° C. Under such temperature condition, the deposited aluminum-silicon film is strongly oriented, and becomes a high-quality aluminum-silicon film without occurrence of hillock or spike in the aluminum-silicon film on a silicon monocrystalline or a silicon polycrystalline substrate even after heat treatment at 450° C. for one hour. Furthermore, such aluminum-silicon film has high electromigration resistance.

In this state, the deposition as shown in Fig. 2F is made feasible, if the non-electron-donative surface is modified into an effective electron-donative surface by generating hydrogen plasma by RF in a hydrogen atmosphere in the reaction tube, and supplying hydrogen atoms and electrons from the plasma to the non-electron-donative surface.

The plasma-generating electrodes comprise an exciting electrode 16 and a grounding electrodes 16' and 16". At the surface modification step, plasma is produced by applying high frequency power of about 13.56 MHz to the electrode 16. Since the exciting electrode 16 is interposed between the grounding electrodes 16' and 16", the lines of electric force terminate almost completely at the grounding electrodes. Therefore the damage of the substrate 1 caused by the plasma is extremely slight. After the selective deposition of aluminum or aluminum-silicon is completed on the electron-donative surface of the substrate having both an electron-donative surface and a non-electron-donative surface, plasma is generated with the supply of DMAH and hydrogen, or DMAH, hydrogen, and $Si_2H_6$ being continued. Electrons and hydrogen atoms supplied from the plasma modifies the non-electron-donative surface. After completion of the surface modification, the plasma generation is stopped, and the deposition formation is continued further.

The partial pressure of the DMAH during the aluminum deposition is not higher than $5\times 10^{-3}$ of the partial pressure of the hydrogen as the reaction gas. Therefore, the properties of the plasma resembles closely that of hydrogen plasma. An excessively high electric power and electron density of the plasma will excite and decompose the DMAH to produce larger nuclei composed mainly of aluminum in the surface modification step, thereby impairing remarkably the surface morphology. On the contrary, excessively low electric power and electron density of the plasma will make the supply of electrons and hydrogen atoms insufficient to reduce remarkably the effect of the surface modification. At the surface modification, the internal pressure of the reaction tube is from 0.1 to 5 Torr, the applied electric power of plasma is from 0.04 to 0.4 $W/cm^3$ with the apparatus of Fig. 3, the time for surface modification is 10 seconds or longer, and the electron density of the plasma in the vicinity of the substrate is from $5\times 10^8$ to $2\times 10^9$ $cm^{-3}$.

After the modification of the non-electron-donative surface, aluminum is deposited non-selectively on the electron-donative surface as well as on the non-electron-donative surface. At this time no carbon was detected at the interface between the selectively deposited aluminum or aluminum-silicon and the non-selectively deposited aluminum or aluminum-silicon. After the surface modification, the deposition may be conducted without stopping the plasma generation. The quality of the film of aluminum or aluminum-silicon deposited with continued plasma application was approximately the same as that of the film deposited without plasma application. The plasma power density applied at the surface modification is less than that applied in usual plasma CVD, reactive ion etching, and the like, and almost no deposition occurs on the surface of the reaction tube.

With the apparatus shown in FIG. 3, a high frequency power source of 13.56 MHz was employed to generate plasma. However, electric discharge generated by direct electric current, alternate current of commmercial frequency, or microwave (e.g., 2.45 GHz ) may be employed.

In another method, an ultra-thin metal film having electron-donative property may be formed on the non-electron-donative surface.

The selective growth is dependent on whether the reaction for forming the desired film proceeds or not on the substrate surface. Hitherto, whether the selective growth occurs or not is considered to be dependent on the difference of the nature of the adsorption points on the substrate surface. If the selectivity in the deposition comes from the difference of the nature of the adsorption points, the selectivity will be impaired, for example, by longer growth time, or higher deposition temperature.

In an example of selective growth of the prior art, there is reported that silicon or tungsten grows on a substrate surface, but does not deposit on silicon dioxide. In this example, it is known that longer growth time or higher deposition temperature causes formation of the nuclei of silicon or tungsten on the silicon dioxide, which impairs the selectivity of the deposition.

In order to utilize the selective growth in an super-LSI process, high selectivity as well as high quality of the deposition film is required. In other words, nucleus, etc. should not be formed on the surface where deposition is not desired.

In the aluminum deposition of the present invention, aluminum deposits on an electron-donative surface, but no aluminum nucleus is formed on a non-electron-donative surface, which is highly selective.

The reaction of aluminum deposition is represented by the formula (1) as a whole. However, from the formula (1) only, the occurrence of the selective growth cannot readily be foreseen. The extremely high selectivity in the present invention is understood by considering the reaction of the formula (1) microscopically. Thereby the deposition of monocrystalline aluminum on monocrystalline silicon substrate as shown in the example below is understood.

The reaction of the formula (1) is explained in the case of deposition of aluminum on a monocrystalline silicon. In super-LSI processes, chemical treatment of monocrystalline silicon is conventionally conducted before forming a deposition film. Generally, the monocrystalline silicon is cleaned with an ammonia type chemical or treated with a sulfuric acid type chemical, subsequently immersed in a dilute hydrofluoric acid solution, and then washed with pure water. After such cleaning step, the surface of the silicon is terminated with hydrogen atoms as shown in portion (A) of FIG. 1.

On the contrary, on the surface of silicon dioxide, the bonds of silicon and oxygen are closed, and the surface is not terminated with hydrogen atoms, or the like. In Si—H, an electric double layer is formed by electron transfer as understood from below since the electronegativity of silicon is smaller.

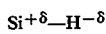

$Si^{+\delta}$—$H^{-\delta}$

When the substrate is heated and DMAH and hydrogen are supplied onto the substrate in a deposition space, the hydrogen dissociates into atomic hydrogen on the surface of silicon, and the H atom terminates an unbonded Si on the silicon surface. It is important that the silicon surface is terminated with H atom, but not with $H_2$ molecular.

DMAH, which is considered to have a dimer structure at room temperature, is adsorbed as a monomer on the heated substrate with the methyl group directing to the substrate surface as shown in portion (A) of FIG. 1.

On the surface where free electrons exist, the aluminum-methyl bond is considered to be weakened by the free electrons. Further, in the field of chemistry, the methyl group is known to react with a hydrogen atom with an activation energy of zero to form methane through the reaction shown in the portion (B) of FIG. 1 (hereinafter referred to as "methanation reaction"). The hydrogen atom terminating the surface of silicon is in a state represented by $$H^{-\delta},$$

so that it reacts readily with a methyl group which has less electron affinity. Moreover, the free electrons residing on the surface catalyzes the methanation reaction.

The methyl group can react also with a hydrogen molecule to form methane. However, the velocity of the reaction of $CH_3 + H(atom) \rightarrow CH_4$ is one or more order larger than that of $CH_3 + (\frac{1}{2})H_2(molecule) \rightarrow CH_4$. Therefore, the methanation reaction proceeds through the reaction with an atomic hydrogen. The aluminum deposits on the silicon, which is an electron-donative substrate, through the reaction shown in portions (A) and (B) in FIG. 1. In this deposition, the important point is that DMAH, the starting raw material gas, has a methyl group which readily reacts selectively with the terminating atom on the substrate surface. When aluminum has deposited through the reaction shown in the portions (A) and (B) of FIG. 1, the surface of the aluminum is in a state of being terminated by hydrogen atoms as shown in portion (C) of FIG. 1. This state is the same as the initial state of portion (A) of FIG. 1. Since the aluminum also contains free electrons, the hydrogen molecule dissociates into hydrogen atoms to terminate the surface of the aluminum. In such a manner the deposition of aluminum continues by adsorption of DMAH and progress of the methanation reaction.

The state of the silicon surface initially terminated with H atoms is genetically maintained after the deposition of aluminum. The hydrogen atoms for terminating the aluminum surface after the aluminum deposition are supplied by H atoms of the DMAH. Therefore, the hydrogen atom of the DMAH may be called a genetic group for maintaining the termination state, and the methyl group of DMAH may be called a selective reaction group for selectively reacting with the surface-terminating atom.

In short, the aluminum deposition reaction is caused by the selective reaction of the terminating hydrogen atom at the surface with the methyl group in the DMAH. The hydrogen atom for the termination is supplied by dissociation of hydrogen molecule at the electron-donative surface of the substrate, and the methanation reaction is catalyzed by the free electrons at the electron-donative surface of the substrate.

On the other hand, the non-electron-donative surface of a substrate such as silicon dioxide is generally not terminated with hydrogen atoms. On the non-electron-donative surface having no free electron, a hydrogen molecule cannot dissociate to terminate the surface even if hydrogen molecules are supplied in a large amount. The Al—$CH_3$ bond is not weakened because of the absence of free electrons, so that the reaction of $CH_3 + H \rightarrow CH_4$ does not occur. Therefore, aluminum deposition does not proceed on a non-electron-donative substrate in the absence of the terminating hydrogen atom for the aluminum deposition and in the absence of free electrons to give rise to the reaction.

Unlike the known reaction based on the difference of the adsorption points, in the system of DMAH + $H_2$, the aluminum deposition reaction is based on the participation of a terminating hydrogen atom and a free electron, bringing about the excellent selectivity in the deposition. After the deposition of aluminum, the hydrogen atoms remain terminating the aluminum surface. Therefore, the selective growth of aluminum can be directive. The aluminum growth in vertical direction is feasible as shown in FIG. 2E, without deposition in lateral direction.

It has made clear that the above reaction is caused by the termination state of the surface and the free electrons. The DMAH molecule is characteristic in that the aluminum atom is bonded to different groups, namely methyl group and hydrogen atom. The DMAH may be called an asymmetric molecule since the aluminum, the growing atom constituting the deposition film, is bonded to the different groups of methyl and hydrogen.

The aluminum growth on monocrystalline silicon is considered further. The chemically treated surface of silicon is terminated by hydrogen atoms as already mentioned. It is noticable that the terminating hydrogens are arranged regularly in a plane on the monocrystalline silicon. Therefore, the deposited aluminum on monocrystalline silicon is also monocrystalline.

When an electron-donative substrate having free electrons is a metal such as aluminum, the surface of substrate is hydrogen-terminated by formation of hydrogen atoms from a hydrogen molecule in the presence of free electrons, or when it is a metal such as tungsten having a d-electron, the surface is hydrogen-terminated by dissociation and adsorption of the hydrogen atoms. By the same reaction as the one shown in portions (A) , (B) , and (C) of FIG. 1, Al, W or the like deposits only on the electron-donative substrate.

Selective deposition of the metal of an organometallic compound on a desired substrate has not been reported, although many investigations have been made on decomposition of organometallic compounds and reactions catalyzed by an organometallic compound in the field of chemistry. The reaction conducted in the present invention is based on the genetic maintenance of the termination state of the substrate surface in the presence of free electrons, which is completely different from the conventional decompositions and reactions of organometallic compound.

The films prepared by aluminum or aluminum-silicon film formation method of the present invention are fine, containing impurity such as carbon in an extremely small amount, having a resistivity approximate to the bulk material, and having high surface flatness, and further exhibit remarkable effect as below:

(1) Decrease of hillock generation in heat treatment,
(2) Improvement in anti-electromigration,
(3) Decrease of alloy pits at contact portions,
(4) Improvement in wiring patterning by higher surface smoothness,
(5) Improvement in resistance in a via hole and contact resistance, and
(6) Lowering of heat treatment temperature in wiring step.

The present invention enables uniform formation of aluminum film even on a substrate composed of both of an electron-donative material and a non-electron-donative material and having roughness of a dimension of μm or sub-micron order by selectively forming deposition film firstly in a concaved portion and by forming film on the whole face of the substrate in the same film-forming apparatus.

In the conventional step of multilayer wiring of super-LSI, decrease of the thickness of a metal film at projection and recess portions on a substrate impairs the reliability of the wiring formation step. However, according to the present invention, an aluminum or aluminum-silicon is deposited to form reliable aluminum or aluminum-silicon film without decrease of the film thickness at the projection and recess portions.

With conventional sputtering technique, it is difficult to form a uniform film on an irregular surface. Therefore, the sectional portions of the openings of insulating film are, for example, made to be slanted according a technique of reflow by high temperature treatment. The slanted portion provided at the opening portion requires unnecessarily additional area, which is against the miniaturization technique.

The present invention enables filling aluminum or aluminum-silicon into a via hole having perpendicular sectional area and forming subsequently aluminum film having excellent smoothness, which is ideal for wiring metal deposition for fine super-LSI circuits.

The substrate is usually treated chemically prior to the deposition as follows:

(a) $[NH_4OH+H_2O_2+H_2O]+$[Water washing]$+[HF/H_2O=1/40]+$[Water washing], or (b) $[H_2SO_4/H_2O_2=3/1]+$[Water washing]$+[HF/H_2O=1/40]+$[Water washing].

By this preliminary treatment, the surface of the substrate becomes terminated with hydrogen atoms and fluorine atoms, and the most of the fluorine atoms are removed off by the final water washing to result in a stable state in which the surface of the substrate is terminated by hydrogen atoms. The substrate having been treated preliminarily as above is employed for deposition in the examples below.

EXAMPLE 1

The aluminum film was formed by the procedure below.

The apparatus shown in FIG. 3 was employed. The reaction tube 2 is evacuated to a pressure of approximately $1\times10^{-8}$ Torr by an evacuation unit 9. Even if the degree of vacuum is less than $1\times10^{-8}$ Torr, aluminum film can be formed.

A silicon wafer, having been washed as above, is placed in the substrate-delivering chamber 10 at an atmospheric pressure. Then the substrate-delivering chamber is evacuated to a pressure of approximately $1\times10^{-6}$, the gate valve 13 is opened, and the wafer is set on the wafer holder 3.

After the wafer is set on the wafer holder 3, the gate valve 13 is closed and the reaction chamber 2 is evacuated to a degree of vacuum of approximately $1\times10^{-8}$ Torr.

In this example, DMAH is supplied through a first gas line, and hydrogen is used as the carrier gas for DMAH line. Hydrogen is supplied through a second gas line.

While supplying the hydrogen through the second gas line, the opening degree of the slow leak valve 8 is adjusted to control the internal pressure of the reaction tube 2 at the desired level. Typically in this Example, the pressure is approximately 1.5 Torr. Then the heater 4 is energized to heat the wafer. After the wafer reaches the predetermined temperature, DMAH is introduced into the reaction tube through the DMAH line. The total pressure is controlled to be at approximately 1.5 Torr, and the partial pressure of DMAH at approximately $1.5\times10^{-4}$ Torr. On introducing the DMAH into the reaction tube 2, aluminum comes to deposit. This aluminum film is referred to as the first aluminum film.

After lapse of the predetermined time of the deposition, an electric voltage is applied, without stopping the supply of DMAH, to the exciting electrode 16 from the high frequency power source (13.56 MHz) to generate hydrogen plasma. On each side of the ring-shaped electrode for RF application, a similar ring-shaped electrode kept at grounding potential is provided, which enables control of the shape of the plasma. In this Example, the plasma was generated with an RF power of 20 W, at an electron density of $1\times10^9 \text{ cm}^{-3}$ in the vicinity of the substrate surface and an electron temperature of 6.5 ev. This step of supply of hydrogen atoms and electrons to the substrate by means of plasma is the surface modification step. After one minute of plasma irradiation, the supply of RF is stopped, and supply of DMAH and hydrogen is further continued, thereby aluminum deposits both on the already deposited aluminum film and on the silicon dioxide film. After the lapse of the predetermined deposition time, the supply of DMAH is stopped. The aluminum film deposited in this step is referred to as the second aluminum film.

With the sample above at the temperature range of from 160° C. to 450° C., aluminum does not deposit in the deposition step of the first aluminum film onto the silicon dioxide portion, but it deposits only at the bared silicon portion to a thickness equal to the silicon dioxide film. While, in the deposition step of the second aluminum film, aluminum deposits onto the first aluminum film as well as onto the silicon dioxide at the same deposition rate.

Subsequently, heating by the heater 4 is stopped, and the wafer is cooled. Then supply of the hydrogen is stopped, and the reaction chamber is evacuated. The wafer is transferred to the substrate-delivering chamber. After the substrate-delivering chamber only is restored to the atmospheric pressure, the wafer is taken out.

The aluminum film is formed by the procedure outlined above.

The samples in this Example were prepared as below. A silicon substrate (N-type, 1–2 Ω.cm) was thermally oxidized by a hydrogen combustion method (hydrogen: 4 l/min, oxygen: 2 l/min) at a temperature of 1000° C. The film thickness was 7000 Å±500 Å. The refractive index was 1.46. A photoresist was applied over the whole face of this silicon substrate, and a desired pattern was projected by an exposure apparatus, the pattern corresponding to various sizes of openings ranging from 0.25 μm×0.25 μm to 100 μm×100 μm. After developing the photoresist, the underlying silicon dioxide was etched by reactive ion etching (RIE) or the like method by utilizing the photoresist as the mask, the silicon substrate becoming partially bared. In such a manner, 130 sheets of a sample having openings of silicon dioxide layer in opening sizes ranging from 0.25 μm×0.25 μm to 100 μm×100 μm were prepared. On these substrates, aluminum was deposited onto the samples at temperatures of 13 levels, with 10 sample sheets being respectively used for each temperature level, The conditions of the first aluminum film deposition step, the surface modification Step, and the second aluminum deposition step were respectively as below:

| First aluminum film deposition: | |
|---|---|
| Total pressure | 1.5 Torr |
| DMAH partial pressure | $1.5 \times 10^{-4}$ Torr |
| Surface modification step: | |
| Total pressure | 1.5 Torr |
| DMAH partial pressure | $1.5 \times 10^{-4}$ Torr |
| RF power | 20 W |
| Surface electron density | $1 \times 10^9$ cm$^{-3}$ |
| Plasma irradiation time | 1 minute |
| Second aluminum film deposition: | |
| Total pressure | 1.5 Torr |
| DMAH partial pressure | $1.5 \times 10^{-4}$ Torr |

The aluminum films formed by deposition at 13 levels of substrate temperature were evaluated, and the results are shown in Table 1.

minum was deposited in the same manner as in Example 1.

The results are shown in Table 2.

TABLE 2

| T (minutes) | Crystallinity of crystals formed on Si | Roughness of aluminum | Si/SiO$_2$ Selectivity |
|---|---|---|---|
| 0 | Polycrystalline | 1500 ÅPP | Some nuclei of Al formed on Si |
| 3 | Monocrystalline | 105 ÅPP | Good |
| 5 | Monocrystalline | 89 ÅPP | Good |
| 7 | Monocrystalline | 110 ÅPP | Good |
| 10 | Monocrystalline | 94 ÅPP | Good |
| 15 | Monocrystalline | 270 ÅPP | Good |
| 18 | Polycrystalline | 800 ÅPP | Good |
| 20 | Polycrystalline | 1125 ÅPP | Good |

During the washing with hydrofluoric acid in the preliminary treatment described above, the surface of

TABLE 1

| | Substrate temperature (°C.) | | | | | |
|---|---|---|---|---|---|---|
| Evaluation items | 150 | 160 | 200 | 250 | 270 | 300 | 330 |
| Carbon content (%) | — | 0 | 0 | 0 | 0 | 0 | 0 |
| Resistivity (μΩ · cm) | — | 2.7~3.3 | 2.7~3.3 | 2.7~3.3 | 2.7~3.3 | 2.7~3.3 | 2.7~3.3 |
| Reflectivity (%) | — | 85~95 | 85~95 | 85~95 | 85~95 | 85~95 | 85~95 |
| Average wiring life (hours) | — | $10^3$~$10^4$ | $10^3$~$10^4$ | $10^3$~$10^4$ | $10^3$~$10^4$ | $10^3$~$10^4$ | $10^3$~$10^4$ |
| Deposition rate (Å/min) | — | 1~9 | 100~800 | 100~800 | 100~800 | 100~800 | 100~800 |
| Hillock density (cm$^{-2}$) | — | 0~$10^3$ | 0~$10^3$ | 0~$10^3$ | 0~10 | 0~10 | 0~10 |
| Spike occurrence ratio (%) | — | 0~10 | 0~10 | 0 | 0 | 0 | 0 |

| | Substrate temperature (°C.) | | | | | |
|---|---|---|---|---|---|---|
| Evaluation items | 350 | 370 | 400 | 430 | 450 | 470 |
| Carbon content (%) | 0 | 0 | 0 | 0 | 0 | 1~9 |
| Resistivity (μΩ · cm) | 2.7~3.3 | 2.7~3.3 | 2.7~3.3 | 2.7~3.3 | 2.7~3.3 | 2.7~3.3 |
| Reflectivity (%) | 85~95 | 85~95 | 85~95 | 70 | 60≧ | 60≧ |
| Average wiring life (hours) | $10^3$~$10^4$ | $10^3$~$10^4$ | $10^3$~$10^4$ | $10^2$~$10^3$ | $10^2$~$10^3$ | $10^2$~$10^3$ |
| Deposition rate (Å/min) | 100~800 | 100~800 | 100~800 | 100~800 | 100~800 | 1000 |
| Hillock density (cm$^{-2}$) | 0~10 | 0~$10^4$ | 0~$10^4$ | 0~$10^4$ | 0~$10^4$ | 0~$10^4$ |
| Spike occurrence ratio (%) | 0 | 0~30 | 0~30 | 0~30 | 0~30 | 0~30 |

Note:
No deposition occurred at 150° C.
"Average wiring life" means the time before disconnection when electric current is made to flow at the current density of 1 × 10$^6$ A/cm$^2$ per 1 μm$^2$ at 250° C.
"Spike occurrence ratio" means the probability of breakdown at the junction portion with the depth of 0.15 μm.

Onto the above samples at the first aluminum film deposition step, aluminum deposited at the temperature range of from 160° C. to 450° C. selectively onto the bared silicon portion to the same thickness as that of the silicon dioxide. The formed aluminum film was monocrystalline. Further in the second aluminum film deposition step, aluminum deposited at the equal rate on the aluminum film having been deposited in the first aluminum film deposition step and on the silicon dioxide surface.

The aluminum film selectively deposited on silicon and the aluminum film deposited on the silicon dioxide after the surface modification are not different from each other in resistivity, reflectivity, and hillock generation density after heat treatment.

Increase of the resistance was not found at the interface between the first aluminum film and the second aluminum film.

EXAMPLE 2

As the substrate treatment before deposition, [H$_2$SO$_4$/H$_2$O$_2$=3/1]+[Water washing]+[HF/-H$_2$O=1/40]+[Water washing], similarly as described above was conducted before the aluminum deposition. In this preliminary treatment, the time (T) for the final water washing was changed as shown below, and aluthe substrate is terminated with hydrogen atoms and fluorine atoms. When the final water washing is insufficient (T=0), the surface has larger amount of fluorine atoms and an oxidation film is formed thicker spontaneously, which hinders the growth of monocrystal. When the water washing is conducted appropriately for 3 to 15 minutes, only the bond of the fluorine atom is severed and the termination with hydrogen atoms to contribute the reaction becomes predominate, which allows the selective growth of aluminum monocrystal.

When the water washing is conducted for excessively long time, the terminating hydrogen atoms are removed, or otherwise the oxidation film grows thicker spontaneously by the action of dissolved oxygen or carbon dioxide in the pure water during prolonged standing of the samples in pure water, which hinders the growth of the monocrystal of aluminum in the aluminum deposition step. The situation was the same when RCA washing was conducted.

After the above selective deposition, the surface modification is carried out by plasma in the same manner as in Example 1, aluminum was deposited over the whole face of the substrate to form wiring.

Example 3

On a monocrystalline wafer having an n+surface, contact holes of 1 μm square were formed with an aspect ratio of the holes of not less than 1. Twelve such wafers were prepared. Each water had 500,000 contact holes formed thereon. On each of those wafers, aluminum films were formed by selective deposition and non-selective deposition, of which formation conditions were conducted on the wafer (1) to (12) in the same manner as in Example 1 except that the plasma electron density (DP) was changed.

Subsequently, on each of the samples, 50 wiring connections were formed by photolithography to connect respectively 10,000 contract holes. The wiring was subjected to open/short test. The number of the wiring connections without failure is represented by the symbol (M).

| Sample No. | Plasma density (DP) | M |
| --- | --- | --- |
| (1) | $1 \times 10^7$ cm$^{-3}$ | 10 |
| (2) | $8 \times 10^7$ cm$^{-3}$ | 10 |
| (3) | $1 \times 10^8$ cm$^{-3}$ | 40 |
| (4) | $2 \times 10^8$ cm$^{-3}$ | 41 |
| (5) | $5 \times 10^8$ cm$^{-3}$ | 49 |
| (6) | $8 \times 10^8$ cm$^{-3}$ | 47 |
| (7) | $1 \times 10^9$ cm$^{-3}$ | 48 |
| (8) | $2 \times 10^9$ cm$^{-3}$ | 49 |
| (9) | $5 \times 10^9$ cm$^{-3}$ | 41 |
| (10) | $8 \times 10^{10}$ cm$^{-3}$ | 41 |
| (11) | $1 \times 10^{11}$ cm$^{-3}$ | 9 |
| (12) | $5 \times 10^{11}$ cm$^{-3}$ | 8 |

Example 4

Two sets of the samples as those formed in Example 3 were prepared. These were heated at 600° C. in a nitrogen atmosphere to eliminate the absorbed hydrogen.

Subsequently one set of the samples were treated with hydrofluoric acid. Thereafter aluminum films were formed to subject to open/short test in the same manner as in Example 3.

| | Hydrogen fluoride treatment | |
| --- | --- | --- |
| Sample No. | Treated | Not treated |
| (1) | M = 9 | M = 1 |
| (2) | 10 | 2 |
| (3) | 41 | 10 |
| (4) | 41 | 12 |
| (5) | 50 | 30 |
| (6) | 49 | 28 |
| (7) | 49 | 29 |
| (8) | 48 | 28 |
| (9) | 40 | 11 |
| (10) | 40 | 11 |
| (11) | 8 | 2 |
| (12) | 8 | 2 |

As described above, the present invention enables deposition of aluminum or aluminum-silicon into a fine via hole having a large aspect ratio, and also enables formation of fine wiring of aluminum or aluminum or aluminum-silicon. Therefore the present invention is effective as ultra-fine processing technology for highly integrated circuits and improves the production yield further.

What is claimed is:

1. A process for forming a deposition film comprising aluminum, comprising the steps of:

placing a substrate having an electron-donative surface and a non-electron-donative surface in a space for deposition film formation in a chemical vapor deposition apparatus capable of generating plasma:

introducing gas comprising alkylaluminum hydride and hydrogen gas into the space for deposition film formation;

forming a first film comprising aluminum selectively on the electron-donative surface by maintaining the electron-donative surface at a temperature in the range of from not lower than the decomposition temperature of the alkylaluminum hydride to not higher than 450° C.;

modifying the non-electron-donative surface by generating plasma while the gas comprising alkylaluminum hydride and the hydrogen gas are introduced, wherein the electron density of the plasma is in the range of from $1 \times 10^8$ to $8 \times 10^{10}$ cm$^{-3}$ in vicinity of the surface of the substrate; and forming a second film comprising aluminum on the first film and the non-electron-donative surface.

2. The process according to claim 1, wherein the substrate is silicon.

3. The process according to claim 1, wherein the substrate is monocrystalline silicon.

4. The process according to claim 1, wherein the electron-donative surface is silicon and the electron-non-donative surface is silicon oxide.

5. The process according to claim 1, wherein the electron-non-donative surface is patterned to define contract holes.

6. The process according to claim 1, wherein the substrate temperature is 270° to 350° C.

7. The process according to claim 1, wherein the surface modification is carried out at a pressure of 0.1 to 5 Torr and at an applied electric power of plasma of 0.04 to 0.4 W/cm$^3$.

8. The process according to claim 1, wherein further film formation is carried out after plasma treatment has been discontinued.

9. The process according to claim 1, wherein further film formation is carried out without stopping the plasma generation.

10. The process according to claim 1, wherein the alkyl aluminum hydride is dimethyl aluminum hydride.

11. The process according to claim 1, wherein the alkyl aluminum hydride is monomethyl aluminum hydride.

12. The process according to claim 10, wherein there is also introduced into the film formation space a gas containing silicon so that aluminum-silicon film is deposited on the substrate.

13. The process according to claim 11, wherein there is also introduced into the film formation space a gas containing silicon so that aluminum-silicon film is deposited on the substrate.

14. The process according to claim 12, wherein the silicon-containing gas is Si$_2$H$_6$.

15. The process according to claim 13, wherein the silicon-containing gas is Si$_2$H$_6$.

16. The process according to claim 10, wherein the partial pressure of the dimethyl aluminum hydride during aluminum deposition is not more than $5 \times 10^{-3}$ of the partial pressure of hydrogen.

17. The process according to claim 10, wherein the internal pressure of the apparatus is $10^{-3}$ to 760 Torr and the dimethyl aluminum hydride is present at a partial pressure $1.5 \times 10^{-5}$ to $1.3 \times 10^{-3}$ of the internal pressure of the reaction vessel.

18. The process according to claim 1, wherein the substrate is chemically treated so that the electron-donative surface becomes terminated with hydrogen atoms and is then introduced into the space for deposition film formation.

19. The process according to claim 18, wherein the chemical surface treatment comprises washing with ammonia solution and hydrogen peroxide solution.

20. The process according to claim 18, wherein the chemical surface treatment comprises washing with sulfuric acid solution and hydrogen peroxide solution.

21. The process according to claim 18, wherein the chemical surface treatment comprises washing with hydrofluoric acid.

22. The process according to claim 18, wherein the chemical surface treatment further comprises washing with water.

23. The process as in any one claims 4–22, wherein there is formed selectively deposited aluminum which is monocrystalline.

* * * * *

UNITED STATES PATENT AND TRADEMARK OFFICE
CERTIFICATE OF CORRECTION

PATENT NO. : 5,364,664

DATED : November 15, 1994

INVENTORS : Tsubouchi et al().

It is certified that error appears in the above-identified patent and that said Letters Patent is hereby corrected as shown below:

COLUMN 1

Line 29, "1" should be deleted.
Line 30, "toughened" should read --roughened--.
Line 59, "end" should read --and--.

COLUMN 2

Line 26, "the the" should read --the--.
Line 41, "to" should be deleted.

COLUMN 3

Line 52, "firstly" should read --initially--.

COLUMN 4

Line 49, "arsine" should read --arsenic--.

COLUMN 5

Line 34, "deposite" should read --deposits--.

COLUMN 6

Line 17, "electron" should read --electrons--.

UNITED STATES PATENT AND TRADEMARK OFFICE
CERTIFICATE OF CORRECTION

PATENT NO. : 5,364,664

DATED : November 15, 1994

INVENTORS : Tsubouchi et al.

It is certified that error appears in the above-identified patent and that said Letters Patent is hereby corrected as shown below:

COLUMN 7

Line 21, "illustrate" should read --illustrates--.

COLUMN 8

Line 5, "rate" should read --rates--.
Line 17, "ter 5" should read --er 5--.
Line 21, "(TICl$_4$)" should read --(TiCl$_4$)--.
Line 39, "Si$_2$H$_6$being" should read --Si$_2$H$_6$ being--.
Line 54, "10$^{-3}$760 Torr" should read --10$^{-3}$ to 760 Torr--.

COLUMN 9

Line 24, "modifies" should read --modify--.

COLUMN 11

Line 18, "catalyzes" should read --catalyze--.

COLUMN 12

Line 15, "made" should read --been made--.
Line 57, "effect" should read --effects--.

UNITED STATES PATENT AND TRADEMARK OFFICE
CERTIFICATE OF CORRECTION

PATENT NO. : 5,364,664

DATED : November 15, 1994

INVENTORS : Tsubouchi et al.

It is certified that error appears in the above-identified patent and that said Letters Patent is hereby corrected as shown below:

COLUMN 15

Line 2, "Step," should read --step,--.

COLUMN 17

Line 6, "water" should read --wafer--.
Line 10, "wafer (1)" should read --wafers (1)--.
Line 15, "contract" should read --contact--.
Line 61, "aluminum or" (second occurrence) should be deleted.

18

Line 31, "contract" should read --contact--.
Line 45, "alkyl aluminum" should read --alkylaluminum--.
Line 48, "alkyl aluminum" should read --alkylaluminum--.
Line 67, "760 Tort" should read --760 Torr--.

COLUMN 19

Line 1, "pressure" should read --pressure of--.

UNITED STATES PATENT AND TRADEMARK OFFICE
CERTIFICATE OF CORRECTION

PATENT NO. : 5,364,664

DATED : November 15, 1994

INVENTORS : Tsubouchi et al.

It is certified that error appears in the above-identified patent and that said Letters Patent is hereby corrected as shown below:

COLUMN 20

Line 10, "one" should read --one of--.

Signed and Sealed this

Twenty-third Day of May, 1995

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO. : 5,364,664
DATED : November 15, 1994
INVENTOR(S) : Tsubouchi, et al

It is certified that error appears in the above-indentified patent and that said Letters Patent is hereby corrected as shown below:

On the title page, item [73] Assignee: "Cannon Kabushiki Kaisha, Tokyo, Japan" should be deleted.

Signed and Sealed this

Eleventh Day of June, 1996

Attest:

BRUCE LEHMAN

*Attesting Officer*    *Commissioner of Patents and Trademarks*